United States Patent
Sano

(10) Patent No.: US 12,376,474 B2
(45) Date of Patent: Jul. 29, 2025

(54) THREE DIMENSIONAL STRETCHABLE OLED/OPD DEVICE

(71) Applicant: Magnolia White Corporation, Tokyo (JP)

(72) Inventor: Takumi Sano, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 450 days.

(21) Appl. No.: 17/894,376

(22) Filed: Aug. 24, 2022

(65) Prior Publication Data

US 2022/0406856 A1 Dec. 22, 2022

Related U.S. Application Data

(63) Continuation of application No. PCT/JP2020/047435, filed on Dec. 18, 2020.

(30) Foreign Application Priority Data

Feb. 28, 2020 (JP) .................... 2020-033371

(51) Int. Cl.
*H10K 59/60* (2023.01)
*H10K 50/86* (2023.01)
(Continued)

(52) U.S. Cl.
CPC ........... *H10K 59/60* (2023.02); *H10K 50/865* (2023.02); *H10K 59/131* (2023.02); *H10K 77/111* (2023.02)

(58) Field of Classification Search
CPC .... H10K 59/60; H10K 50/865; H10K 59/131; H10K 77/111; H10F 55/00; H05K 1/02; H05K 1/14
See application file for complete search history.

(56) References Cited

U.S. PATENT DOCUMENTS 12,148,378 B2 * 11/2024 Lee ..................... G09G 3/32
2010/0214525 A1 8/2010 Yamaguchi et al.
(Continued)

FOREIGN PATENT DOCUMENTS

JP 2003-234500 A 8/2003
JP 2010-197813 A 9/2010
(Continued)

OTHER PUBLICATIONS

Kwon, Jimin, et al. "Three-dimensional monolithic integration in flexible printed organic transistors." Nature Communications, vol. 10, No. 1, Jan. 3, 2019, https://doi.org/10.1038/s41467-018-07904-5. (Year: 2021).*

(Continued)

*Primary Examiner* — Joe E. Schoenholtz
(74) *Attorney, Agent, or Firm* — K&L Gates LLP

(57) ABSTRACT

According to one embodiment, an electronic device comprises first and second flexible substrates. The first flexible substrate comprises a first insulating base includes first island portions and first strip portions connecting the first island portions, first electrical elements placed on the first island portions, and first lines placed on the first strip portions. The second flexible substrate comprises a second insulating base includes second island portions and second strip portions connecting the second island portions, second electrical elements placed on the second island portions, and second lines placed on the second strip portions.

15 Claims, 8 Drawing Sheets

(51) Int. Cl.
*H10K 59/131* (2023.01)
*H10K 77/10* (2023.01)

(56) References Cited

U.S. PATENT DOCUMENTS

| | | | |
|---|---|---|---|
| 2014/0220422 A1 | 8/2014 | Rogers et al. | |
| 2015/0131238 A1 | 5/2015 | Lee | |
| 2015/0282294 A1 | 10/2015 | Wakuda et al. | |
| 2015/0382457 A1* | 12/2015 | Tomita | H05K 1/0283 |
| | | | 174/254 |
| 2017/0181276 A1* | 6/2017 | Sawada | B32B 27/38 |
| 2020/0037442 A1 | 1/2020 | Keum et al. | |
| 2022/0384747 A1* | 12/2022 | Sun | H10K 77/111 |
| 2023/0075199 A1* | 3/2023 | Tian | H10K 59/19 |
| 2023/0255068 A1* | 8/2023 | Yeon | H10K 59/131 |
| | | | 257/40 |
| 2023/0337514 A1* | 10/2023 | Kim | H10D 86/60 |
| 2024/0224580 A1* | 7/2024 | Park | H10K 50/844 |
| 2024/0431194 A1* | 12/2024 | Park | H10K 77/111 |

FOREIGN PATENT DOCUMENTS

| | | |
|---|---|---|
| JP | 2013-145842 A | 7/2013 |
| JP | 2013-187380 A | 9/2013 |
| JP | 2014-022675 A | 2/2014 |
| JP | 2015-198101 A | 11/2015 |
| JP | 2016-509759 A | 3/2016 |
| JP | 2017-118085 A | 6/2017 |
| JP | 2017-118109 A | 6/2017 |
| JP | 2019-216273 A | 12/2019 |

OTHER PUBLICATIONS

Kalkal, Ashish, et al. "Recent advances in 3D Printing Technologies for Wearable (bio)sensors." Additive Manufacturing, vol. 46, Oct. 2021, p. 102088, https://doi.org/10.1016/j.addma.2021. 102088. (Year: 2021).*
International Search Report issued in International Patent Application No. PCT/JP2020/047435 on Feb. 22, 2021 and English translation of same. 7 pages.
Written Opinion issued in International Patent Application No. PCT/JP2020/047435 on Feb. 22, 2021. 5 pages.
English translation of Office Action issued in related Japanese Patent Application No. 2020-033371, mailed on Feb. 27, 2024. 3 pages.

* cited by examiner

THREE DIMENSIONAL STRETCHABLE OLED/OPD DEVICE

CROSS-REFERENCE TO RELATED APPLICATIONS

This application is a Continuation Application of PCT Application No. PCT/JP2020/047435 filed Dec. 18, 2020 and based upon and claiming the benefit of priority from Japanese Patent Application No. 2020-033371, filed Feb. 28, 2020, the entire contents of all of which are incorporated herein by reference.

FIELD

Embodiments described herein relate generally to an electronic device.

BACKGROUND

In recent years, the use of flexible substrates having flexibility and elasticity has been studied in various fields. For example, it is conceivable that a flexible substrate with electrical elements arranged in a matrix is used in the state of being attached to a curved surface, such as the housing of an electronic device or the human body. As the electrical elements, various sensors, for example, touch sensors, temperature sensors, and optical sensors, and display elements can be applied.

In a flexible substrate, measures must be taken to prevent lines from being damaged by stress due to bending or expansion/contraction. As the measures, there has been a proposal to, for example, provide a honeycombed opening in a base supporting the lines or form the lines into a meandering shape (meander shape).

In an electronic device, for example, an optical sensor, electrical elements having different functions, such as light-emitting elements and photoreceivers, may be placed in separate substrates. In this case, it is required that the structure of the electronic device be devised so as not to inhibit its flexibility.

DETAILED DESCRIPTION

Figure 1:
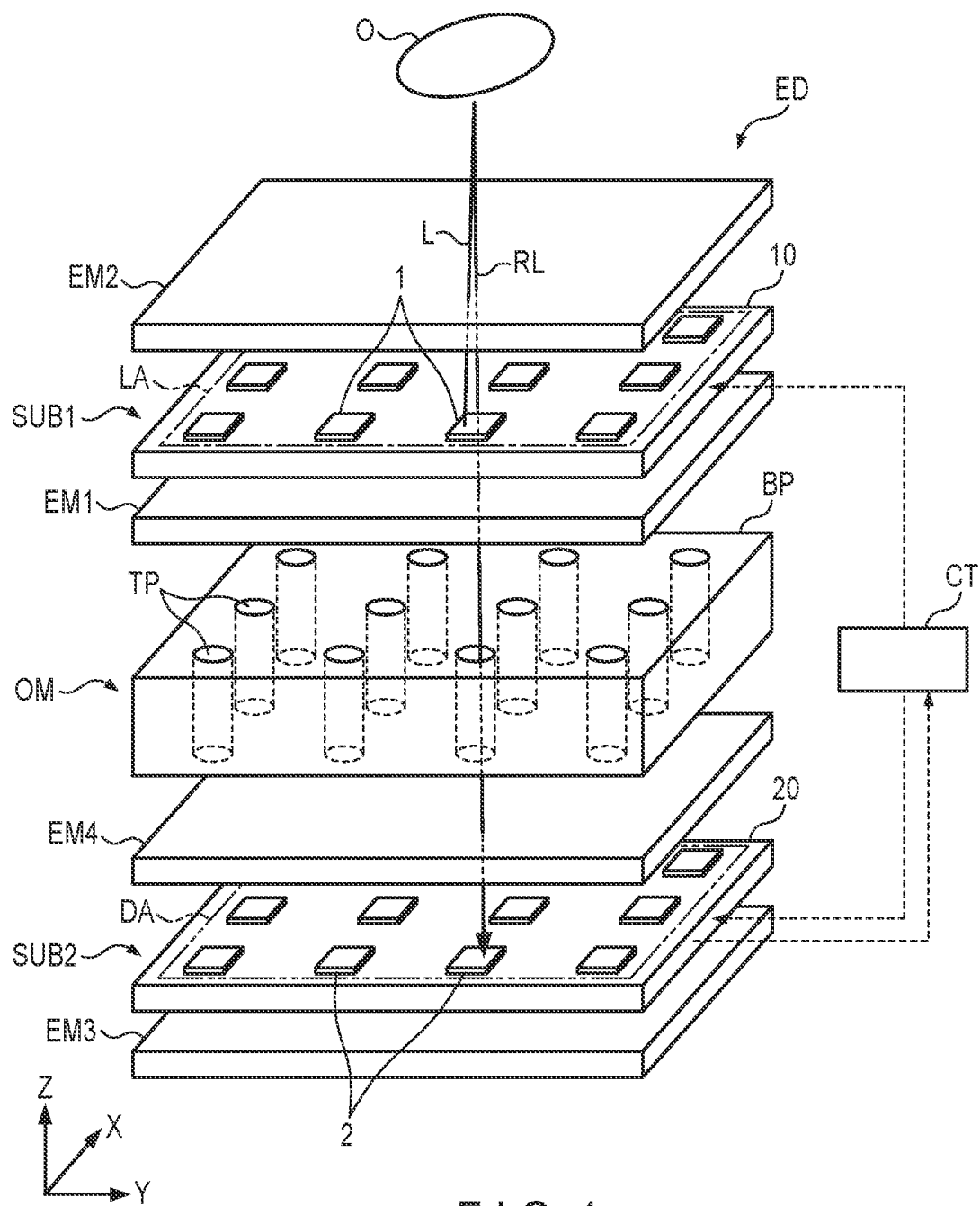
FIG. 1 is a schematic exploded perspective view of an electronic device according to an embodiment.

In general, according to one embodiment, an electronic device comprises a first flexible substrate and a second flexible substrate overlapping the first flexible substrate. The first flexible substrate comprises a first insulating base comprising first island portions and first strip portions connecting the first island portions, first electrical elements placed on the first island portions, respectively, and first lines placed on the first strip portions, respectively. The second flexible substrate comprises a second insulating base comprising second island portions and second strip portions connecting the second island portions, second electrical elements placed on the second island portions, respectively, and second lines placed on the second strip portions, respectively.

The above configuration can enable an electronic device comprising electrical elements having different functions to exhibit excellent flexibility.

One of the embodiments will be described with reference to the accompanying drawings.

The disclosure is merely an example, and proper changes within the spirit of the invention which are easily conceivable by a person having ordinary skill in the art are included in the scope of the present invention as a matter of course. In addition, in order to make the description clearer, the drawings may be produced more schematically than in the actual modes, but they are mere examples and do not limit the interpretation of the present invention. In the drawings, the reference symbols of the same or similar elements successively arranged may be omitted. In the specification and drawings, the structural elements that have the same or similar functions as or to those described in connection with preceding drawings are denoted by the same reference symbols, and a detailed description thereof may be omitted.

In the present embodiment, an electronic device which is an optical sensor comprising light-emitting elements and photoreceivers is disclosed as an example. However, the configuration of the electronic device is applicable to various electronic devices, such as other types of sensor and display devices.

FIG. 1 is a schematic exploded perspective view of an electronic device ED according to the present embodiment. In the present embodiment, a first direction X, a second direction Y, and a third direction Z are defined as shown in the figure. The first direction X, the second direction Y, and the third direction Z cross perpendicularly, but may cross at angles other than 90 degrees. In the following description, viewing the electronic device ED and its structural elements parallel to the third direction Z is referred to as planar view. In addition, the direction indicated by the arrow of the third direction Z may be referred to as an upward direction, and its opposite direction may be referred to as a downward direction.

The electronic device ED comprises a first flexible substrate SUB1, a second flexible substrate SUB2, an optical member OM, a first elastic member EM1, a second elastic member EM2, a third elastic member EM3, and a fourth elastic member EM4. In the example of FIG. 1, these elements each have a rectangular shape having two sides extending in the first direction X and two sides extending in the second direction Y. However, these elements may have other shapes, such as polygonal shapes except a rectangle, a circular shape, or an elliptic shape.

The first flexible substrate SUB1 and the second flexible substrate SUB2 overlap in the third direction Z. The first flexible substrate SUB1 comprises a light-emitting area LA, first electrical elements 1 arranged in a matrix in the light-emitting area LA, and a first insulating base 10 supporting the first electrical elements 1. The second flexible substrate SUB2 comprises a detection area DA, second electrical elements 2 arranged in a matrix in the detection area DA, and a second insulating base 20 supporting the second electrical elements 2.

The optical member OM is placed between the first flexible substrate SUB1 and the second flexible substrate SUB2. The optical member OM comprises light-transmitting portions TP transmitting light and a light-blocking portion BP blocking light. Each of the light-transmitting portions TP overlaps one of the second electrical elements 2 in the third direction Z. Moreover, each of the light-transmitting portions TP may overlap one of the first electrical elements 1 in the third direction Z. The light-blocking portion BP is, for example, black resin, and surrounds each of the light-transmitting portions TP.

In the example of FIG. 1, each of the light-transmitting portions TP has a cylindrical shape long in the third direction Z. However, the light-transmitting portions TP may have other shapes such as a prismatic shape. The side surface of each of the light-transmitting portions TP is covered by the light-blocking portion BP. On the other hand, the upper surface and the lower surface of each of the light-transmitting portions TP are exposed through the light-blocking portion BP.

The first elastic member EM1 is placed below the first flexible substrate SUB1. The second elastic member EM2 is placed above the first flexible substrate SUB1. The third elastic member EM3 is placed below the second flexible substrate SUB2. The fourth elastic member EM4 is placed above the second flexible substrate SUB2. The elastic members EM1 to EM4 can be formed of, for example, transparent resin materials having elasticity.

In the present embodiment, the first electrical elements 1 are light-emitting elements, and the second electrical elements 2 are photoreceivers. The first electrical elements 1 emit visible light L, for example, in the third direction Z. The light L may be emitted not only in the third direction Z, but also in a direction crossing the third direction Z or downward from the first electrical elements 1. In addition, the light L may be light in a wavelength range other than that of visible light.

When an object O exists above the electronic device ED, the light L emitted by the first electrical elements 1 is reflected by the object O. Reflected light R L is transmitted through the second elastic member EM2, the first flexible substrate SUB1, and the first elastic member EM1 in order, and reaches the optical member OM.

The reflected light RL, which is incident on the light-transmitting portions TP at an angle near the angle at which the reflected light RL is parallel to the third direction Z, is transmitted through the light-transmitting portions TP and further through the fourth elastic member EM4, and received by the second electrical elements 2. The second electrical elements 2 output signals according to the received light. On the other hand, light incident on the upper surface of the light-blocking portion BP and light incident on the light-transmitting portions TP at a wide angle to the third direction Z are absorbed by the light-blocking portion BP. In this manner, the optical member OM functions as a collimator which adjusts light incident on the second electrical elements 2.

The first flexible substrate SUB1 and the second flexible substrate SUB2 are controlled by a controller CT. The controller CT may be a structural element of the electronic device ED or may be another device connected to the electronic device ED.

For example, the controller CT supplies the first flexible substrate SUB1 with a signal (voltage) for causing each of the first electrical elements 1 to emit light. In addition, the controller CT supplies the second flexible substrate SUB2 with a signal for operating each of the second electrical elements 2, and executes various processes based on signals output by the second electrical elements 2.

The purposes for which the electronic device ED is used are not particularly limited, and for example, the electronic device ED can be used as a physiological sensor. In this case, the object O is a part of the human body, such as a finger or wrist, and the controller CT generates physiological data on a pulse wave, etc., based on signals output by the second electrical elements 2.

Figure 2:
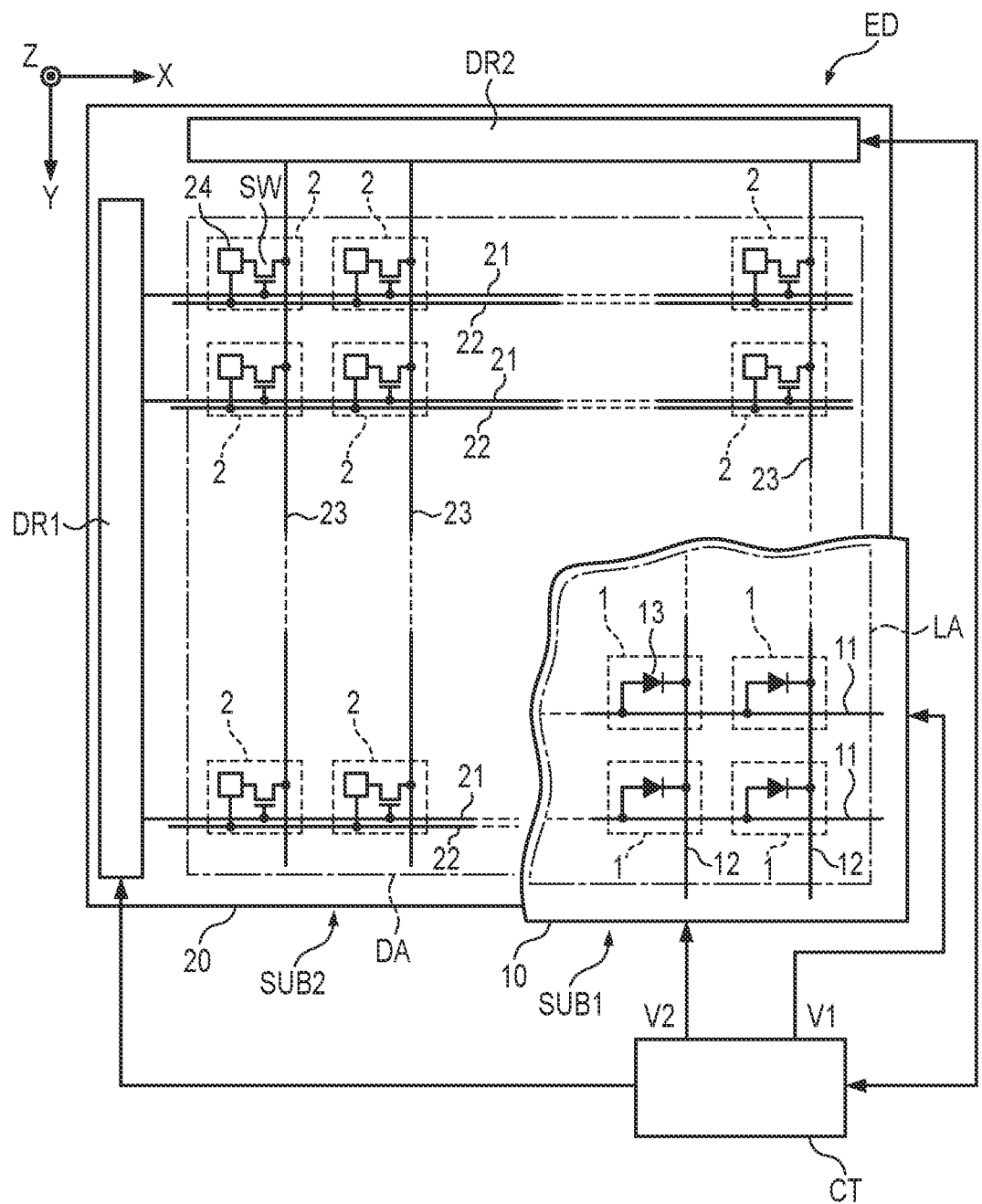
FIG. 2 is a diagram schematically showing the circuit configuration of the electronic device.

FIG. 2 is a diagram schematically showing the circuit configuration of the electronic device ED according to the present embodiment. In this figure, a part of the first flexible substrate SUB1 is removed.

The first flexible substrate SUB1 comprises first power lines 11 and second power lines 12 in addition to the above-described first electrical elements 1. The first power lines 11 extend in the first direction X and are arranged in the second direction Y in the light-emitting area LA. The second power lines 12 extend in the second direction Y and are arranged in the first direction X in the light-emitting area LA.

The first electrical elements 1 each comprise a light-emitting portion 13. As the light-emitting portions 13, various elements which can emit light in response to voltage application can be applied. In the present embodiment, the light-emitting portions 13 are assumed to be light-emitting diodes (LEDs). However, the light-emitting portions 13 may be organic electroluminescent (EL) elements or the like.

For example, the light-emitting portions 13 are micro-LEDs with the longest side shorter than or equal to 100 μm. However, the light-emitting portions 13 may be, for example, mini-LEDs with the longest side longer than 100 μm but shorter than 300 μm. In addition, the light-emitting portions 13 may be LEDs with the longest side longer than or equal to 300 μm.

In the example of FIG. 2, the light-emitting portions 13 are connected to the first power lines 11 and the second power lines 12. The controller CT supplies the first power lines 11 with a first voltage V1 and supplies the second power lines 12 with a second voltage V2. For example, the first voltage V1 is a high voltage, and the second voltage V2 is a low voltage lower than the first voltage V1. The light-emitting portions 13 emit light in accordance with the potential difference between the first voltage V1 and the second voltage V2.

The second flexible substrate SUB2 comprises scanning lines 21, power lines 22, signal lines 23, a first driver DR1, and a second driver DR2 in addition to the above-described second electrical elements 2. The scanning lines 21 extend in the first direction X and are arranged in the second direction Y in the detection area DA. The power lines 22 extend in the first direction X and are arranged in the second direction Y in the detection area DA. The signal lines 23 extend in the second direction Y and are arranged in the first direction X in the detection area DA.

The second electrical elements 2 each comprise a light-receiving portion 24 which generates a signal according to incident light, and a switching element SW. The gate electrodes of the switching elements SW are connected to the scanning lines 21, and the source electrodes and the drain electrodes of the switching elements SW are connected to the signal lines 23 and the light-receiving portions 24, respectively. The power lines 22 are also connected to the light-receiving portions 24. The power lines 22 are supplied with a common voltage. For example, photodiodes can be used as the light-receiving portions 24.

The first driver DR1 and the second driver DR2 are placed outside the detection area DA. Each of the scanning lines 21 is connected to the first driver DR1. Each of the signal lines 23 is connected to the second driver DR2.

The first driver DR1 supplies a scanning signal to each of the scanning lines 21 sequentially. In each of the second electrical elements 2, when a scanning signal is supplied to the scanning line 21, the switching element SW is turned on. At this time, a signal generated by the light-receiving portion 24 is output to the signal line 23. The second driver DR2 acquires the signal output to the signal line 23, and outputs it to the controller CT.

The wavelength of light emitted by the first electrical elements 1 can be selected as appropriate in accordance with the purpose for which the electronic device ED is used. For example, the first electrical elements 1 may include a first electrical element 1 which emits light in the red wavelength range, a first electrical element 1 which emits light in the green wavelength range, and a first electrical element 1 which emits light in the blue wavelength range. In this case, white light can be obtained by causing the first electrical elements 1 of the respective colors to emit light simultaneously. In addition, for example, to detect the above pulse wave with the electronic device ED, light in the green wavelength range, which is absorbed by hemoglobin in blood at a high rate, should preferably be used as a light source. Accordingly, for such a purpose, all the first electrical elements 1 may emit light in the green wavelength range.

For example, in the configuration of the first flexible substrate SUB1 shown in FIG. 2, all the first electrical elements 1 in the light-emitting area LA emit light simultaneously. However, the first flexible substrate SUB1 may have an active-matrix circuit configuration like the second flexible substrate SUB2. In this case, the first electrical elements 1 are provided with switching elements connected to the light-emitting portions 13. Moreover, scanning lines and signal lines connected to the switching elements are placed in the light-emitting area LA. In each of the first electrical elements 1, when a scanning signal is supplied to the scanning line, the switching element is turned on and the light-emitting portion 13 emits light in accordance with a signal (voltage) supplied to the signal line.

Figure 3:
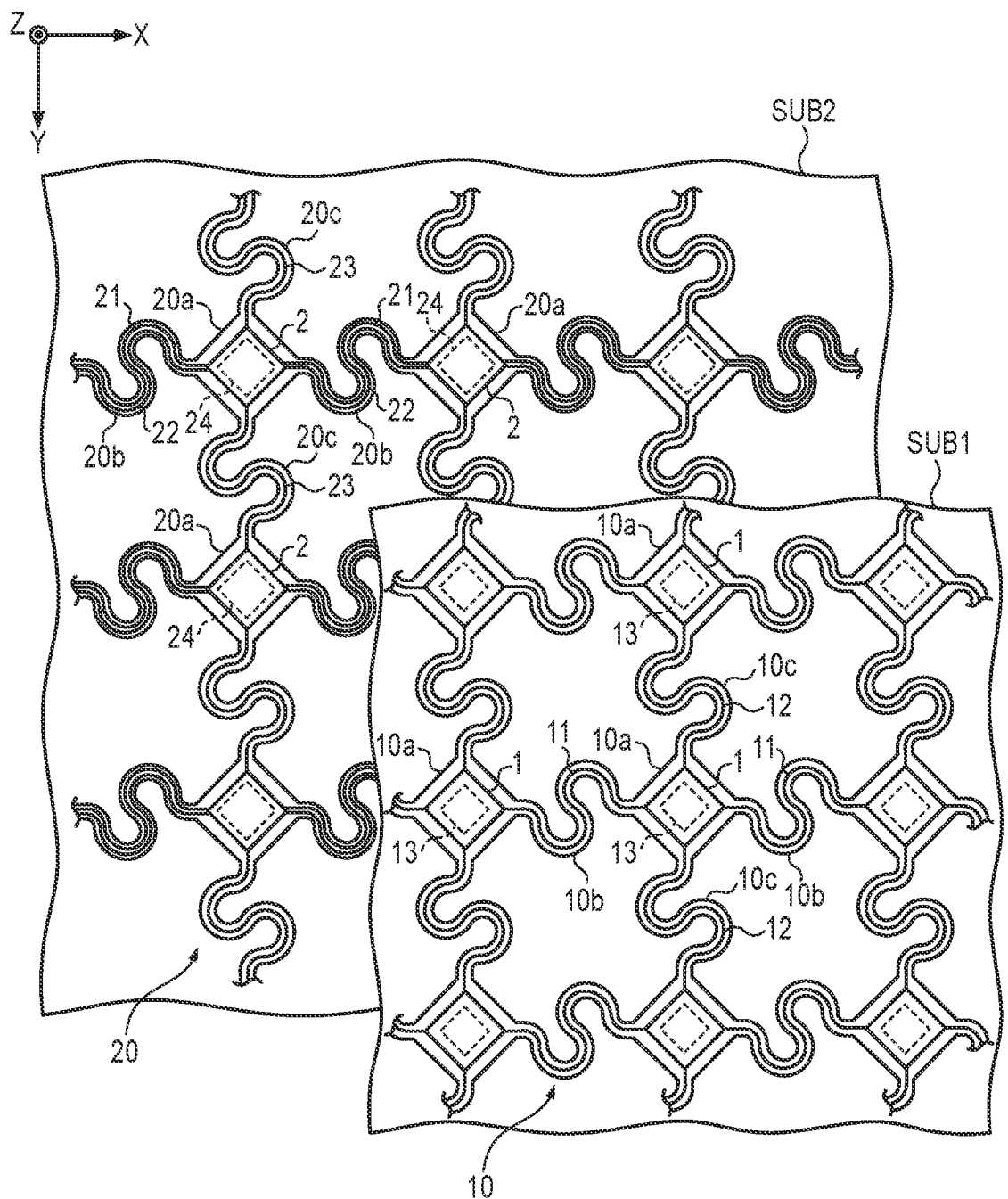
FIG. 3 is an enlarged schematic plan view showing parts of a first flexible substrate and a second flexible substrate of the electronic device.

FIG. 3 is an enlarged schematic plan view of parts of the first flexible substrate SUB1 and the second flexible substrate SUB2. In the first flexible substrate SUB1, the first insulating base 10 comprises island portions 10a. The island portions 10a are arranged in a matrix in the first direction X and the second direction Y. In the example of FIG. 3, the island portions 10a are squares, but the island portions 10a may be other shapes such as rectangles, rhombuses, perfect circles, or ellipses.

The first insulating base 10 further comprises first strip portions 10b and second strip portions 10c. The first strip portions 10b each connect two island portions 10a adjacent to each other in the first direction X. The second strip portions 10c each connect two island portions 10a adjacent to each other in the second direction Y. In the example of FIG. 3, the first strip portions 10b and the second strip portions 10c are connected to the corner portions of the island portions 10a, respectively. As another example, the first strip portions 10b and the second strip portions 10c may be connected to the straight sides of the island portions 10a, respectively.

Both the first strip portions 10b and the second strip portions 10c are not straight. In the example of FIG. 3, each of the first strip portions 10b and the second strip portions 10c curves widely twice and has a shape meandering in an S-shape as a whole. Such a shape may be referred to as a meander pattern. However, the shapes of the first strip portions 10b and the second strip portions 10c are not limited to the example of FIG. 3. For example, various shapes such as a shape with only one curve, a shape with more than three curves, or a shape extending straight in a direction crossing the first direction X and the second direction Y, can be applied. The shapes of the first strip portions 10b and the second strip portions 10c may be different from each other.

The first insulating base 10 is formed of, for example, polyimide. In this case, the island portions 10a, the first strip portions 10b, and the second strip portions 10c can be formed integrally by patterning a polyimide film. The material of the first insulating base 10 is not limited to polyimide, and other resin materials also can be used.

The first electrical elements 1 including the light-emitting portions 13 are placed on the island portions 10a. In addition, the first power lines 11 are placed on the first strip portions 10b, and the second power lines 12 are placed on the second strip portions 10c. The first power lines 11 and the second power lines 12 meander in the same way as the first strip portions 10b and the second strip portions 10c. The first power lines 11 and the second power lines 12 are examples of first lines.

In this manner, the first insulating base 10 comprises the island portions 10a, and the first strip portions 10b and the second strip portions 10c which connect the island portions 10a, thereby enabling the first flexible substrate SUB1 to have elasticity. That is, when tensile force or compressive force in a specific direction acts on the first flexible substrate SUB1, the first strip portions 10b and the second strip portions 10c expand or contract in accordance with the tensile force or compressive force. The first flexible substrate SUB1 is thereby deformed into a shape according to the tensile force or compressive force.

The second insulating base 20 also has the same shape as that of the first insulating base 10. That is, the second insulating base 20 comprises island portions 20a arranged in a matrix, first strip portions 20b each connecting two island portions 20a adjacent to each other in the first direction X, and second strip portions 20c each connecting two island portions 20a adjacent to each other in the second direction Y. The second insulating base 20 can be formed of polyimide like the first insulating base 10, but may be formed of other resin materials.

The second electrical elements 2 including the light-receiving portions 24 are placed on the island portions 20a. In addition, the scanning lines 21 and the power lines 22 are placed on the first strip portions 20b, and the signal lines 23 are placed on the second strip portions 20c. The scanning lines 21, the power lines 22, and the signal lines 23 meander in the same way as the first strip portions 20b and the second strip portions 20c. The scanning lines 21, the power lines 22, and the signal lines 23 are examples of second lines.

In this manner, the second insulating base 20 comprises the island portions 20a, the first strip portions 20b, and the second strip portions 20c, thereby enabling the second flexible substrate SUB2 to have the same elasticity as that of the first flexible substrate SUB1.

Figure 4:
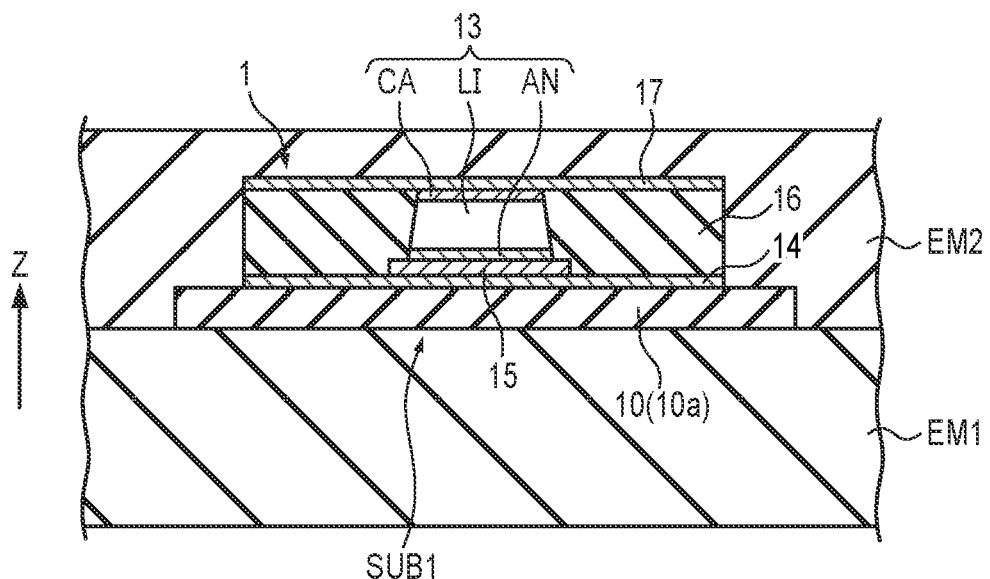
FIG. 4 is a schematic cross-sectional view of the first flexible substrate in an island portion.
Figure 5:
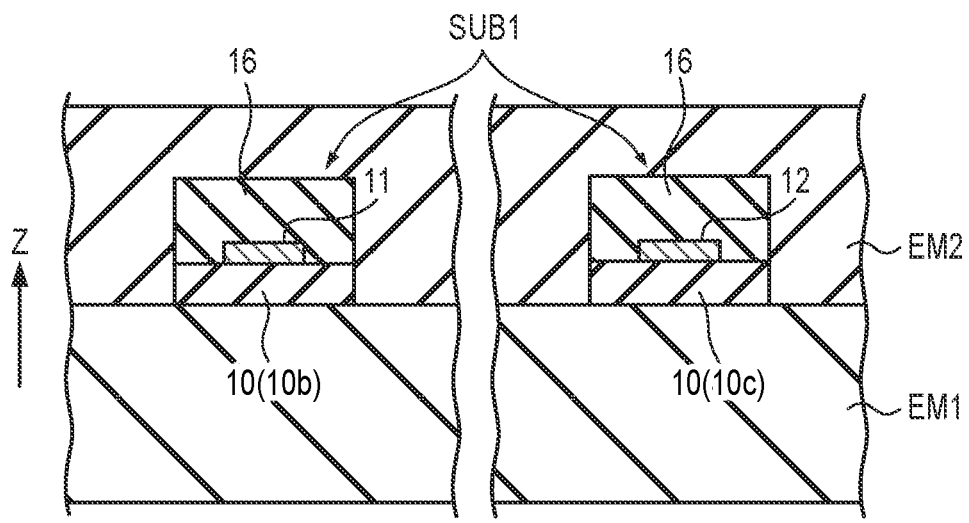
FIG. 5 is a schematic cross-sectional view of the first flexible substrate in a first strip portion and a second strip portion.

FIG. 4 is a schematic cross-sectional view of the first flexible substrate SUB1 in the island portion 10a. FIG. 5 is a schematic cross-sectional view of the first flexible substrate SUB1 in the first strip portion 10b and the second strip portion 10c. These figures also show the first elastic member EM1 and the second elastic member EM2.

As shown in FIG. 4, each of the first electrical elements 1 comprises a first electrode 14, a connection layer 15, an insulating layer 16, and a second electrode 17 in addition to the above-described light-emitting portion 13. The first electrode 14 is placed on the island portion 10a. An insulating layer or a conductive layer may be interposed between the first electrode 14 and the island portion 10a. The connection layer 15 is, for example, solder, and contacts the upper surface of the first electrode 14.

The light-emitting portion 13 is placed on the connection layer 15. The light-emitting portion 13 comprises an anode AN, a cathode CA, and a light-emitting layer LI placed between the anode AN and the cathode CA. The anode AN contacts the upper surface of the connection layer 15. The insulating layer 16 covers the first electrode 14 and the side surfaces of the connection layer 15 and the light-emitting portion 13. The cathode CA is exposed through the insulating layer 16. The second electrode 17 is placed on the cathode CA and the insulating layer 16, and contacts the cathode CA.

As shown in FIG. 5, the first power line 11 is placed on the first strip portion 10b, and the second power line 12 is placed on the second strip portion 10c. An insulating layer may be interposed between the first power line 11 and the first strip portion 10b and between the second power line 12 and the second strip portion 10c. The first power line 11 and the second power line 12 are each covered by the insulating layer 16.

At positions different from the cross sections of FIG. 4 and FIG. 5, the first electrode 14 is connected to the first power line 11 and the second electrode 17 is connected to the second power line 12. That is, the first voltage V1 of the first power line 11 is applied to the anode AN via the first electrode 14, and the second voltage V2 of the second power line 12 is applied to the cathode CA via the second electrode 17.

The light-emitting layer LI emits light in accordance with the potential difference between the anode AN and the cathode CA.

The first electrode 14 is formed of, for example, a metallic material, but may be formed of a transparent conductive material such as indium tin oxide (ITO). The second electrode 17 is formed of a transparent conductive material such as ITO. The insulating layer 16 is formed of an organic insulating material such as photosensitive acrylic resin. The first power line 11 and the second power line 12 are formed of metallic materials.

The island portions 10a, the first strip portions 10b, the second strip portions 10c, and the elements placed thereon are located between the first elastic member EM1 and the second elastic member EM2. The lower surfaces of the island portions 10a, the first strip portions 10b, and the second strip portions 10c contact the first elastic member EM1. In an area where the island portions 10a, the first strip portions 10b, and the second strip portions 10c are not provided, the first elastic member EM1 and the second elastic member EM2 contact each other. The first elastic member EM1 and the second elastic member EM2 are formed of, for example, resin having a modulus of elasticity (Young's modulus) less than that of the first insulating base 10.

Figure 6:
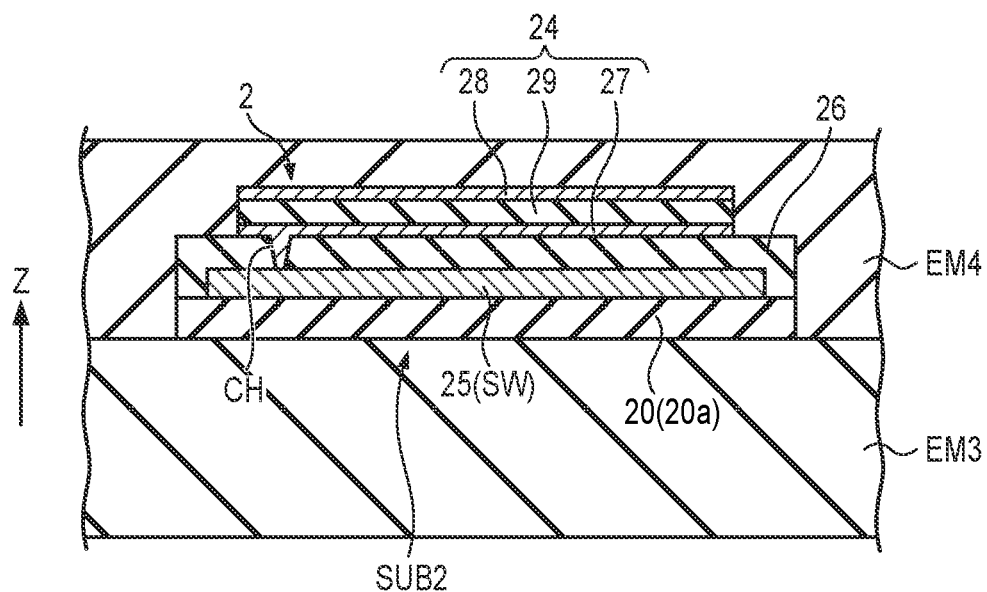
FIG. 6 is a schematic cross-sectional view of the second flexible substrate in an island portion.
Figure 7:
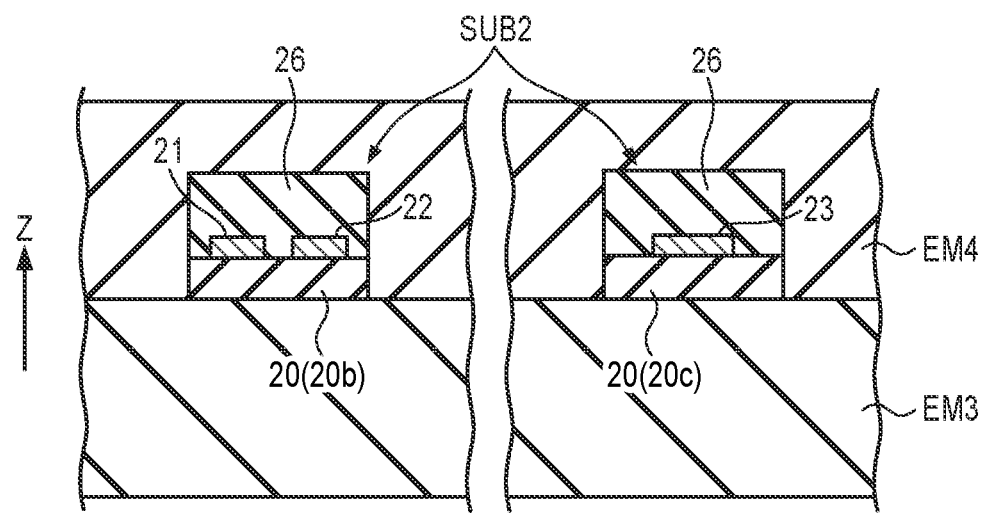
FIG. 7 is a schematic cross-sectional view of the second flexible substrate in a first strip portion and a second strip portion.

FIG. 6 is a schematic cross-sectional view of the second flexible substrate SUB2 in the island portion 20a. FIG. 7 is a schematic cross-sectional view of the second flexible substrate SUB2 in the first strip portion 20b and the second strip portion 20c. These figures also show the third elastic member EM3 and the fourth elastic member EM4.

As shown in FIG. 6, each of the second electrical elements 2 comprises a circuit layer 25 and an insulating layer 26 in addition to the above-described light-receiving portion 24. The circuit layer 25 is placed on the island portion 20a. An insulating layer or a conductive layer may be interposed between the circuit layer 25 and the island portion 20a. The circuit layer 25 includes various types of thin-film transistor such as the above-described switching element SW, and lines. The insulating layer 26 covers the circuit layer 25.

The light-receiving portion 24 is placed on the insulating layer 26. The light-receiving portion 24 is, for example, an organic photodetector (OPD), and comprises a first electrode 27, a second electrode 28, and an active layer 29 placed between the first electrode 27 and the second electrode 28. The first electrode 27 is placed on the insulating layer 26, and connected to the circuit layer 25 (switching element SW) via a contact hole CH.

As shown in FIG. 7, the scanning line 21 and the power line 22 are placed on the first strip portion 20b, and the signal line 23 is placed on the second strip portion 20c. An insulating layer may be interposed between the scanning line 21 and the power line 22, and the first strip portion 20b. Similarly, an insulating layer may be interposed between the signal line 23 and the second strip portion 20c. The scanning line 21, the power line 22, and the signal line 23 are each covered by the insulating layer 26.

In the example of FIG. 7, the scanning line 21 and the power line 22 are placed in the same layer, but the scanning line 21 and the power line 22 may be placed in different layers. In this case, the scanning line 21 and the power line 22 may be opposed with an insulating layer interposed therebetween in the third direction Z. At positions different from the cross sections of FIG. 6 and FIG. 7, the scanning line 21 and the signal line 23 are connected to the circuit layer 25 (switching element SW), and the power line 22 is connected to the second electrode 28. That is, the common voltage of the power line 22 is applied to the second electrode 28.

The first electrode 27 is formed of, for example, a metallic material, but may be formed of a transparent conductive material such as indium tin oxide (ITO). The second electrode 28 is formed of a transparent conductive material such as ITO. The insulating layer 26 is formed of an organic insulating material such as photosensitive acrylic resin. The scanning line 21, the power line 22, and the signal line 23 are formed of metallic materials.

The active layer 29 includes an electron donor (p-type semiconductor) and an electron acceptor (n-type semiconductor) formed of organic materials. An electron-transport layer is formed between the first electrode 27 and the active layer 29, and a hole-transport layer is formed between the second electrode 28 and the active layer 29. When light is incident on the active layer 29, a current according to the light is produced. The current is output to the signal line 23 via the first electrode 27 and the switching element SW.

The island portions 20a, the first strip portions 20b, the second strip portions 20c, and the elements placed thereon are located between the third elastic member EM3 and the fourth elastic member EM4. The lower surfaces of the island portions 20a, the first strip portions 20b, and the second strip portions 20c contact the third elastic member EM3. In an area where the island portions 20a, the first strip portions 20b, and the second strip portions 20c are not provided, the third elastic member EM3 and the fourth elastic member EM4 contact each other. The third elastic member EM3 and the fourth elastic member EM4 are formed of, for example, resin having a modulus of elasticity less than that of the second insulating base 20. The elastic members EM1 to EM4 may be formed of the same material or may be formed of different materials.

Figure 8:
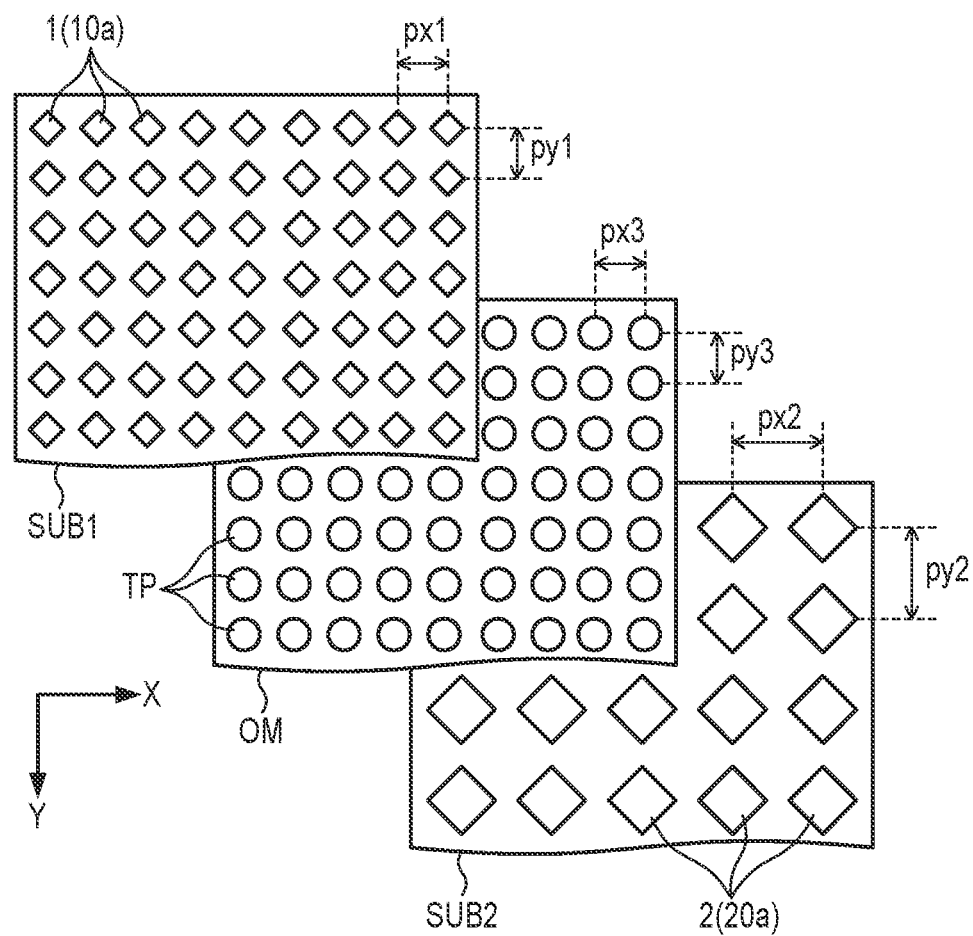
FIG. 8 is a plan view schematically showing the relationship between first electrical elements, second electrical elements, and light-transmitting portions.

FIG. 8 is a plan view schematically showing the relationship between the first electrical elements 1, the second electrical elements 2, and the light-transmitting portions TP. As shown in the figure, the first electrical elements 1 are arranged at a first pitch px1 in the first direction X and arranged at a first pitch py1 in the second direction Y. The second electrical elements 2 are arranged at a second pitch px2 in the first direction X and arranged at a second pitch py2 in the second direction Y. In addition, the light-transmitting portions TP are arranged at a third pitch px3 in the first direction X and arranged at a third pitch py3 in the second direction Y.

The first pitch px1 and the first pitch py1 are also the pitches of the island portions 10a, and the second pitch px2 and the second pitch py2 are also the pitches of the island portions 20a. For example, the first pitch px1 and the first pitch py1 are equal to each other, the second pitch px2 and the second pitch py2 are equal to each other, and the third pitch px3 and the third pitch py3 are equal to each other.

In order to enhance the intensity of light emitted by the first flexible substrate SUB1, the first electrical elements 1 should preferably be placed with higher fineness than the second electrical elements 2. In this case, the second pitch px2 is larger than the first pitch px1 (px1<px2), and the second pitch py2 is larger than the first pitch py1 (py1<py2).

In addition, depending on the relationship between the second electrical elements 2 and the light-transmitting portions TP, moire due to the light-transmitting portions TP may be produced, which can have a bad influence on the sensing of the second electrical elements 2. Thus, to reduce such moire, the fineness of the light-transmitting portions TP should preferably be higher than that of the second electrical elements 2. In this case, the third pitch px3 is smaller than the second pitch px2 (px2>px3), and the third pitch py3 is smaller than the second pitch py2 (py2>py3).

The relationship between the fineness of the first electrical elements 1, the fineness of the second electrical elements 2, and the fineness of the light-transmitting portions TP are not limited to the example described herein. As another example, the pitches px1 to px3 in the first direction X may be equal to each other. Similarly, the pitches py1 to py3 in the second direction Y may be equal to each other.

Figure 9:
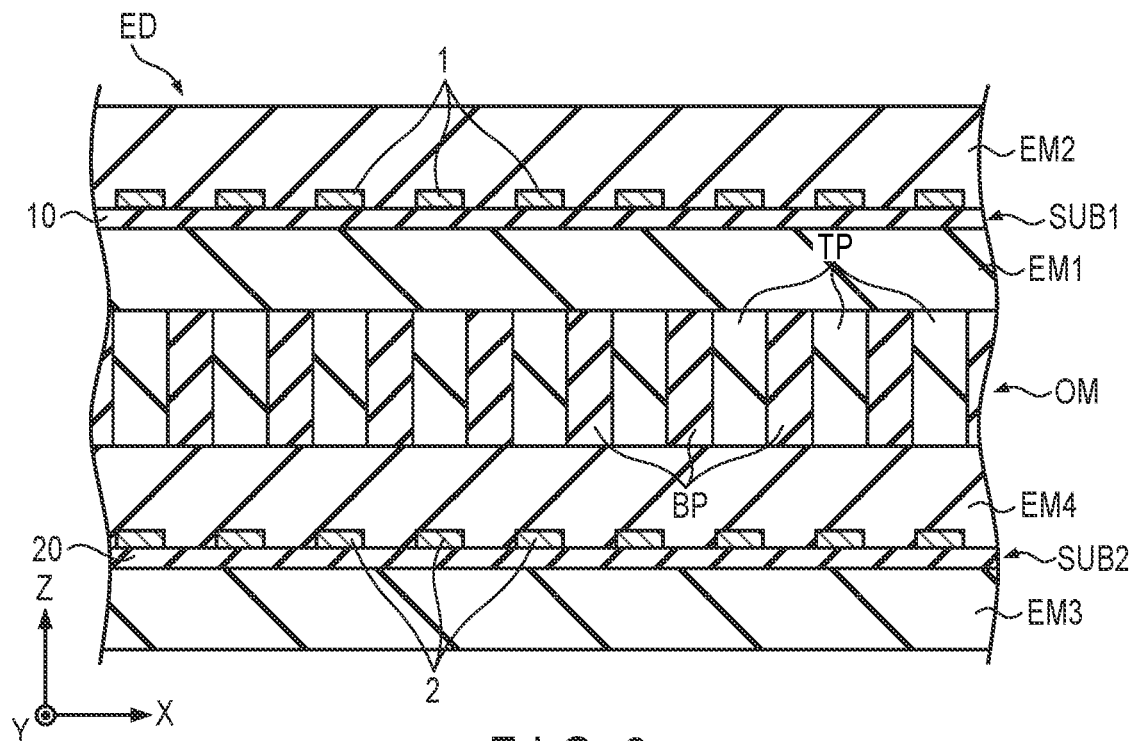
FIG. 9 is a schematic cross-sectional view of the electronic device.

FIG. 9 is a schematic cross-sectional view of the electronic device ED. The first elastic member EM1 adheres to the lower surface of the first flexible substrate SUB1 and the upper surface of the optical member OM. The fourth elastic member EM4 adheres to the upper surface of the second flexible substrate SUB2 and the lower surface of the optical member OM.

In the example of FIG. 9, the first electrical elements 1, the second electrical elements 2, and the light-transmitting portions TP overlap in the third direction Z, but are not limited to this example. The first electrical elements 1 may be placed at positions not overlapping the light-transmitting portions TP in the third direction Z. In addition, the light-transmitting portions TP narrower than the second electrical elements 2 may overlap the second electrical elements 2 in the third direction Z.

In the present embodiment, the modulus of elasticity of the light-blocking portion BP is less than that of the light-transmitting portions TP. For example, the modulus of elasticity of the light-transmitting portions TP should preferably be ten or more times greater than the modulus of elasticity of the light-blocking portion BP. In addition, the modulus of elasticity of the light-blocking portion BP should preferably be less than those of the first flexible substrate SUB1 and the second flexible substrate SUB2.

Figure 10:
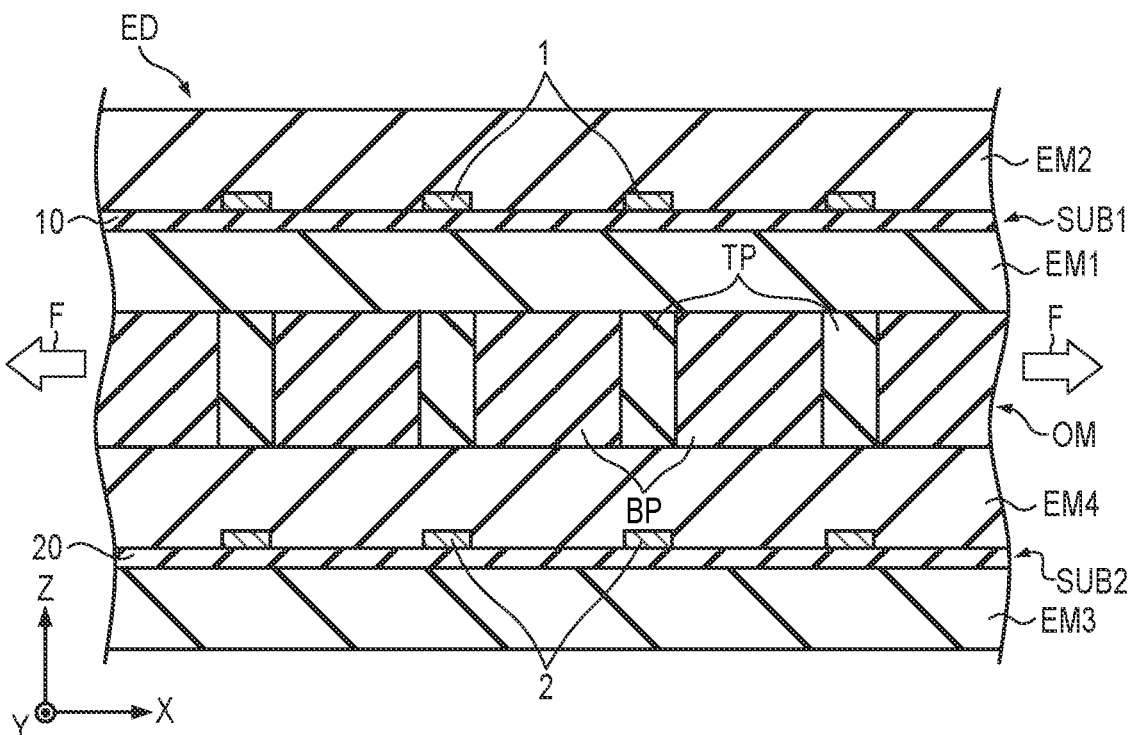
FIG. 10 is a schematic cross-sectional view showing a state in which tensile force acts on the electronic device shown in FIG. 9.

FIG. 10 is a schematic cross-sectional view showing a state in which tensile force F parallel to the first direction X acts on the electronic device ED shown in FIG. 9. In the present embodiment, the first insulating base 10 and the second insulating base 20 have the shapes shown in FIG. 3. Thus, the first flexible substrate SUB1 and the second flexible substrate SUB2 both can expand or contract in an X-Y plane including the first direction X and the second direction Y.

Moreover, if the moduli of elasticity of the light-blocking portion BP and the elastic members EM1 to EM4 are less than those of the first flexible substrate SUB1 and the second flexible substrate SUB2 as described above, these elements also can expand or contract in the X-Y plane. Accordingly, when the tensile force F acts, the whole electronic device ED is extended in the first direction X.

In the example of FIG. 10, since the first flexible substrate SUB1 and the second flexible substrate SUB2 are extended, the gap between the adjacent first electrical elements 1 and the gap between the adjacent second electrical elements 2 are both larger than those of the example of FIG. 9.

If the positional relationship between the first electrical elements 1 and the second electrical elements 2 changes before and after the extension of the first flexible substrate SUB1 and the second flexible substrate SUB2, the sensing of the electronic device ED can become unstable. Thus, the moduli of elasticity of the first flexible substrate SUB1 and the second flexible substrate SUB2 should preferably be equal to each other. In this case, the degrees of stretch of the first flexible substrate SUB1 and the second flexible substrate SUB2 with respect to predetermined tensile or compressive stress are equal to each other, and the positional relationship between the first electrical elements 1 and the second electrical elements 2 is maintained. As a result, even if the first flexible substrate SUB1 and the second flexible substrate SUB2 are extended, the sensing of the electronic device ED is stable. The moduli of elasticity of the first flexible substrate SUB1 and the second flexible substrate SUB2 may be different. Also in this case, it is preferable that the positional relationship between the first electrical elements 1 and the second electrical elements 2 be maintained before and after extension, or that the first electrical elements 1 and the second electrical elements 2 be placed so as not to overlap each other even if the positional relationship between the first electrical elements 1 and the second electrical elements 2 changes.

In the optical member OM, since the modulus of elasticity of the light-blocking portion BP is less than that of the light-transmitting portions TP as described above, the light-blocking portion BP is more likely to deform than the light-transmitting portions TP. Thus, when the tensile force F acts, the light-blocking portion BP especially is extended. Since the light-blocking portion BP especially deforms in this manner, the positional relationship between the light-transmitting portions TP and the second electrical elements 2 is maintained even if the tensile force F is applied. As a result, this can suppress condensing of undesirable light in the second electrical elements 2 due to deformation of the light-transmitting portions TP and misalignment between the light-transmitting portions TP and the second electrical elements 2.

The above-described advantages can be similarly achieved also in a case where force other than the tensile force F in the first direction X is applied to the electronic device ED. Such force is assumed to be compressive force in the first direction X, tensile force or compressive force in the second direction Y, the tensile force F or compressive force in a direction crossing the first direction X and the second direction Y, etc. In addition, the electronic device ED can be bent into a freely selected shape.

In this manner, the present embodiment can achieve the electronic device ED which exhibits excellent flexibility and performs sensing with excellent precision.

The configurations of the first flexible substrate SUB1, the second flexible substrate SUB2, and the optical member OM are not limited to those described in the present embodiment.

Figure 11:
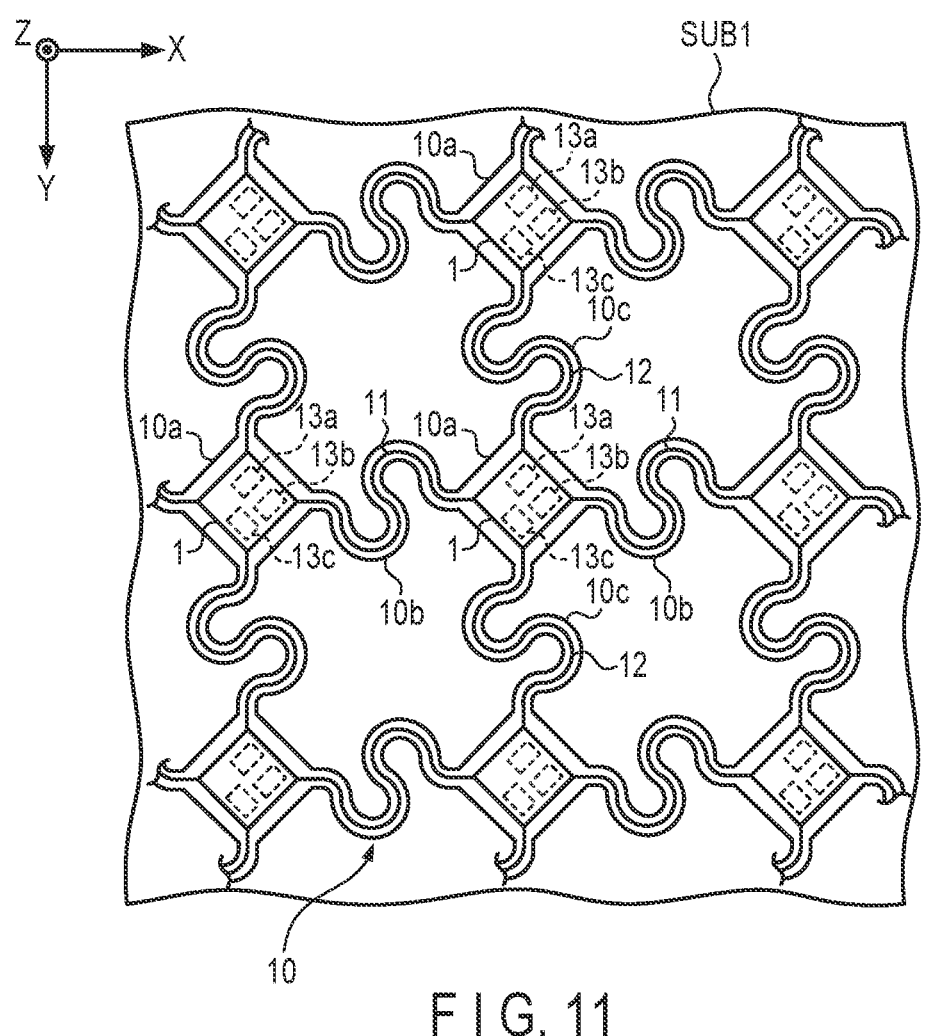
FIG. 11 is a schematic plan view showing another example of the first flexible substrate.

FIG. 11 is a schematic plan view showing another example of the first flexible substrate SUB1. In the example of this figure, the first electrical elements 1 each comprise a first light-emitting portion 13a, a second light-emitting portion 13b, and a third light-emitting portion 13c.

The first light-emitting portion 13a, the second light-emitting portion 13b, and the third light-emitting portion 13c are, for example, LEDs which emit light in different wavelength ranges. For example, the first light-emitting portion 13a emits light in the red wavelength range, the second light-emitting portion 13b emits light in the green wavelength range, and the third light-emitting portion 13c emits light in the blue wavelength range.

The first light-emitting portion 13a, the second light-emitting portion 13b, and the third light-emitting portion 13c may emit light simultaneously. In addition, an active-matrix circuit configuration may be applied to the first flexible substrate SUB1 to enable selective light emission and individual luminance adjustment of the first light-emitting portion 13a, the second light-emitting portion 13b, and the third light-emitting portion 13c.

Furthermore, the number of light-emitting portions 13 of each of the first electrical elements 1 is not limited to three, and may be two or may be four or more. Similarly, the second electrical elements 2 may each comprise light-receiving portions 24.

The first electrical elements 1 may each comprise, for example, a light-emitting portion such as an LED which emits light in a wide wavelength range including the red, green, and blue wavelength ranges. In this case, a spectral member for separating light in a specific wavelength range from light emitted by the light-emitting portion may be provided in each of the first electrical elements 1.

In the present embodiment, the configuration in which the first flexible substrate SUB1 is located above the second flexible substrate SUB2 (between the object O and the second flexible substrate SUB2) as shown in FIG. 1 has been described. As another example, the first flexible substrate SUB1 may be located below the second flexible substrate SUB2. In this case, light emitted by each of the first electrical elements 1 of the first flexible substrate SUB1 may be transmitted through the second flexible substrate SUB2 and the light-transmitting portions TP and irradiated to the object O.

All of the electronic devices that can be embodied by making design changes to the electronic devices described as the embodiments of the present invention as appropriate by a person having ordinary skill in the art also fall within the scope of the present invention as long as they are in keeping with the spirit of the present invention.

Various modifications are easily conceivable within the category of the ideas of the present invention by a person having ordinary skill in the art, and the modifications are also considered to fall within the scope of the present invention. For example, additions, deletions or changes in design of the structural elements, or additions, omissions or changes in condition of the processes conducted as appropriate by a person having ordinary skill in the art in the above embodiments fall within the scope of the present invention as long as they are in keeping with the spirit of the present invention.

In addition, the other advantages of the aspects described in the embodiments that are obvious from the descriptions of the present specification or can be conceived as appropriate by a person having ordinary skill in the art are considered to be achievable by the present invention as a matter of course.

What is claimed is:

1. An electronic device comprising a first flexible substrate and a second flexible substrate overlapping the first flexible substrate,
   the first flexible substrate comprising:
   a first insulating base comprising first island portions and first strip portions connecting the first island portions;
   first electrical elements placed on the first island portions, respectively; and
   first lines placed on the first strip portions, respectively,
   the second flexible substrate comprising:
   a second insulating base comprising second island portions and second strip portions connecting the second island portions;
   second electrical elements placed on the second island portions, respectively; and
   second lines placed on the second strip portions, respectively.

2. The electronic device of claim 1, wherein
   the first electrical elements are light-emitting elements which emit light, and
   the second electrical elements are photoreceivers which detect light.

3. The electronic device of claim 2, further comprising an optical member overlapping the second flexible substrate, wherein
   the optical member comprises light-transmitting portions overlapping the second electrical elements and a light-blocking portion surrounding the light-transmitting portions.

4. The electronic device of claim 3, wherein
   the optical member is placed between the first flexible substrate and the second flexible substrate.

5. The electronic device of claim 1, wherein
   the first electrical elements are arranged at a first pitch, and
   the second electrical elements are arranged at a second pitch larger than the first pitch.

6. The electronic device of claim 3, wherein
the second electrical elements are arranged at a second pitch, and
the light-transmitting portions are arranged at a third pitch smaller than the second pitch.

7. The electronic device of claim 3, wherein
the light-blocking portion has a modulus of elasticity less than the modulus of elasticity of the light-transmitting portions.

8. The electronic device of claim 7, wherein
the modulus of elasticity of the light-blocking portion is less than the moduli of elasticity of the first flexible substrate and the second flexible substrate.

9. The electronic device of claim 1, wherein
the moduli of elasticity of the first flexible substrate and the second flexible substrate are equal to each other.

10. The electronic device of claim 1, further comprising a first elastic member and a second elastic member, wherein
the first flexible substrate is located between the first elastic member and the second elastic member.

11. The electronic device of claim 10, wherein
the first elastic member and the second elastic member contact each other in an area where the first island portions and the first strip portions are not provided.

12. The electronic device of claim 10, wherein
the moduli of elasticity of the first elastic member and the second elastic member are less than the modulus of elasticity of the first insulating base.

13. The electronic device of claim 1, further comprising a third elastic member and a fourth elastic member, wherein
the second flexible substrate is located between the third elastic member and the fourth elastic member.

14. The electronic device of claim 13, wherein
the third elastic member and the fourth elastic member contact each other in an area where the second island portions and the second strip portions are not provided.

15. The electronic device of claim 13, wherein
the moduli of elasticity of the third elastic member and the fourth elastic member are less than the modulus of elasticity of the second insulating base.

* * * * *